(12) United States Patent
Gudesen

(10) Patent No.: US 6,649,504 B2
(45) Date of Patent: Nov. 18, 2003

(54) METHOD FOR FABRICATING HIGH ASPECT RATIO ELECTRODES

(75) Inventor: Hans Gude Gudesen, Brussels (BE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/300,801

(22) Filed: Nov. 21, 2002

(65) Prior Publication Data

US 2003/0134502 A1 Jul. 17, 2003

Related U.S. Application Data

(60) Provisional application No. 60/339,539, filed on Dec. 14, 2001.

(30) Foreign Application Priority Data

Dec. 14, 2001 (NO) .......................................... 20016096

(51) Int. Cl.⁷ .............................................. H01L 21/44
(52) U.S. Cl. ...................... 438/597; 438/625; 438/643; 438/653; 438/666; 438/668; 438/669
(58) Field of Search ............................... 438/597–598, 438/622, 625, 642–643, 652–653, 666, 668–669

(56) References Cited

U.S. PATENT DOCUMENTS

| 5,017,515 A | | 5/1991 | Gill |
| 5,227,329 A | * | 7/1993 | Kobayashi et al. .......... 438/652 |
| 6,117,760 A | | 9/2000 | Gardner et al. |
| 6,204,143 B1 | | 3/2001 | Roberts et al. |
| 6,358,810 B1 | * | 3/2002 | Dornfest ...................... 438/653 |
| 6,476,488 B1 | * | 11/2002 | Jeng et al. ................... 438/597 |
| 2002/0022357 A1 | * | 2/2002 | Iijima et al. ................. 438/622 |

FOREIGN PATENT DOCUMENTS

| WO | PCT/NO02/00390 | 10/2002 |
| WO | PCT/NO02/00397 | 11/2002 |
| WO | PCT/NO02/00414 | 11/2002 |

* cited by examiner

*Primary Examiner*—John F. Niebling
*Assistant Examiner*—Lynne A. Gurley
(74) *Attorney, Agent, or Firm*—Jacobson Holman PLLC

(57) ABSTRACT

In a method for building high aspect ratio electrodes in an electrode means (E) comprising parallel electrodes ($\epsilon_1,\epsilon_2$) in a dense arrangement, the electrodes are built in a repeatedly performed sequence of successive process steps involving the use of only one and the same photomask in every patterning step, the electrodes being formed with a desired aspect ratio according to the number of times the sequence is repeated, and top surface of the electrode means planarized in a final process step.

14 Claims, 7 Drawing Sheets

METHOD FOR FABRICATING HIGH ASPECT RATIO ELECTRODES

Figure 1:

This is a complete application claiming benefit of provisional No. 60/339,539 filed Dec. 14, 2001.

The present invention concerns a method for building high aspect ratio electrodes in an electrode means comprising parallel electrodes in a dense arrangement, wherein the method comprises successive process steps for a) depositing a first global layer of electrode material with height h on a substrate, b) patterning the electrode material to form first parallel electrodes of the electrode means, said first electrodes having a width w and height h and being separated by a recess of width d, and wherein the method is characterized by comprising successive further process steps for c) covering the first electrodes with a barrier layer of thickness δ, δ being a fraction of width w, whereby the width d of the recess becomes equal to 2w+2δ, d) depositing a second global layer of electrode material over the first electrodes with the barrier layer and filling the recesses therewith, e) patterning a second layer of electrode material to form second parallel electrodes of the electrode means in the recesses between the electrodes and the barrier layer covering the latter, said second electrodes extending above the first electrodes to a height H–h and being insulated therefrom by means of the barrier layer, whereafter the sequence of process steps c)–e) are alternatingly applied as required to the first and second electrodes respectively until the desired aspect ratio for all electrodes is obtained in a final process step after performing n sequences of the successive process steps c)–e), a final process step comprising applying electrode material to obtain electrodes with approximately equal height and then removing excess electrode material in a planarizing process.

The present invention is related to a method for manufacturing an electrode means as disclosed in the co-pending international patent application No. PCT/NO02/00414 and belonging to the same applicant. This patent application teaches a method for making an electrode means comprising parallel strip-like electrodes in a first and second electrode layers respectively, and contacting a global layer of a functional medium provided therebetween. The electrodes of the second layer are oriented orthogonally to the electrodes of the first layer, forming a matrix of electrodes that is capable of addressing functional elements in the functional medium, said elements being defined as volume element thereof between the respective crossing electrodes of the first and second layer. The parallel strip-like electrodes in each layer are provided in a very dense arrangement, allowing a very high fill factor of electrode material in a given device area. Actually this fill factor can be made close to unity as the parallel strip-like electrodes in a layer will be mutually separated by very thin insulating barrier layer only and this barrier layer has a width that is only a fraction of the width of the parallel strip-like electrodes. Electrode means of this kind are suited for use in matrix-addressable devices, for instance a memory device with a functional medium in the form of a ferroelectric memory material sandwiched between two electrode layers, such that the electrodes of the first electrode layer may form word lines and the electrodes in the second electrode layer bit lines in the electrode means, such that a memory cell can be defined and addressed at the crossing between an electrode of respectively the first and the second electrode layers.

The dense electrode arrangement in electrode means of this kind can e.g. be applied to a memory device of the kind disclosed in the co-pending international patent application PCT/NO02/00390, wherein memory material is not only provided in sandwich, but also additionally applied over the side edges of the addressing electrodes or in recesses provided therein, thus allowing the switching of memory cells not only in the vertical direction, as will be the case with the ferroelectric memory material sandwiched between electrode means, but also in lateral directions such that multidirectionally switchable ferroelectric memory cells are obtained. Similar electrode means with the electrodes in a dense arrangement are also discussed in the co-pending international patent application PCT/NO02/00397 belonging to the same applicant and disclosing a field-effect transistor structure with extremely short channel length.

A method for fabricating dense electrodes are generally disclosed in U.S. Pat. No. 5,017,515 (Gill, assigned to Texas Instruments Inc.). This publication discloses how a dense electrode pattern can be formed as an electrode layer with parallel strip-like electrodes having a width corresponding to a minimum definable feature obtainable in a photolithographic process. Adjacent parallel strip-like electrodes are mutually insulated by a thin barrier of insulating material, and the thickness of this barrier is not constrained by design rules as applicable to photomicrolithographic and etching processes. Every second strip-like electrode is formed in a photolithographic process while the additional electrodes provided between these by providing electrode material over the parallel strip-like electrode structures already in place and filling the recesses therebetween, whereafter a planarization step leaves a single electrode layer of parallel strip-like electrodes with a low aspect ratio and mutually isolated by a thin barrier of insulating material.

In all applications as disclosed by the three abovementioned co-pending Norwegian patent applications, it will be desirable to employ electrodes with a high aspect ratios, i.e. with a ratio between the electrode height h and the electrode width w as large as possible. In ferroelectric memory applications a high aspect ratio is of great importance when the memory cells are provided in geometrical configurations that shall allow their definition in three dimensions and permit not only a vertical switching direction, but also lateral switching directions. In such cases the memory cell height will be equal or almost equal to the height of the addressing electrodes. In integrated transistor/memory structures with ultrashort channel length the ferroelectric material is provided between the source and drain electrodes of a field-effect transistor provided on e.g. a silicon substrate with appropriately doped regions. The ferroelectric memory material now provides a memory cell that is switchable in lateral directions and which moreover also functions as a gate insulator, as it will not only be present between the source and drain electrodes, but also covers the top surfaces thereof and ensures that the gate electrode is properly insulated from the former. Such a configuration moreover offers the possibility of a three-bit or triple memory cell, as using the electrodes of the transistors for addressing the ferroelectric memory material now shall allow the storage of three separately addressable bits therein, or, as given by a protocol, a three-bit word.

If a switchable or addressable functional material is provided so as to be switched between electrodes in a dense electrode arrangement, the height dimension of the cell is of course important and will be equal to the electrode height. Unfortunately the electrode height does not scale with the electrode density, but as it will be important to improve the signal noise ratio and signal strength in general by increasing the electrode height and thus also the height of a cell of a functional material contacting the electrode at sides thereof, it is desirable to have electrodes with very high aspect ratios.

However, building electrodes with very large aspect ratio, i.e. a high value of h/w is a challenging task in a present-day silicon technology relying on photomicrolithographic processes and etching. If the etching is to take place over an extended area, it will be very difficult to obtain uniform and even side edges, i.e. the side walls of the electrodes formed in the etching process, and there is an inherent danger of undercutting the side edges in the etching process. Generally there will be a problem obtaining the desired uniformity of the structures thus realized and there will always be present a risk of e.g. ending up with defects that may be susceptible to electrical faults etc. Within the scope of present-day technology it is moreover difficult to envisage how electrodes with a large aspect ratio can be built without involving a large number of repeatedly performed process steps including planarization and the use of different photomasks.

Particularly for silicon-based circuitry in general and particularly for silicon-based memory devices, e.g. of the DRAM and SRAM types, high aspect rations of the electrodes is important for instance with the view to obtaining high capacitance which translates into correspondingly improved signal strength and signal/noise ratios in memory devices.

In view of the above considerations and the problems of obtaining high aspect ratio electrodes for use in switching and memory circuits wherein the high aspect ratio is desirable, it is thus a major object of the present invention to provide a method for fabricating electrodes with high aspect ratio for electrode means with parallel electrodes in a very dense arrangement.

A second object of the present invention is to simplify any masking and planarization step involved in the fabrication of electrodes with high aspect ratio in electrode means of the above kind.

A third object of the present invention is to fabricate electrode means with high aspect ratio without the application of, e.g. a barrier and memory material between the electrodes creating problems, when considering that the electrodes in dense electrode arrangements in separated by a very small distance, thus forming recesses therebetween which when the aspect ratio is high, causes problems of obtaining the desired filling of any material therein.

The above-mentioned objects as well as additional features and advantages are obtained with a method according to the invention characterized by comprising successive further process steps for c) covering the first electrodes with a barrier layer of thickness δ, δ being a fraction of the width w, whereby the width d of the recess becomes equal to w+2δ, d) depositing a second global layer of electrode material over the first electrodes with the barrier layer and filling the recesses therewith, e) patterning a second layer of electrode material to form second parallel electrodes of the electrode means in the recesses between the electrodes and the barrier layer covering the latter, said second electrodes extending above the first electrodes to a height H−h and being insulated therefrom by means of the barrier layer; whereafter the sequence of process steps c)–e) are alternatingly applied as required to the first and second electrodes respectively until the desired aspect ratio (n+1)(H−h)/w for all electrodes is obtained in a final process step after performing n sequences of the successive process steps c)–e), a final process step comprising applying electrode material to obtain electrodes with approximately equal height (n+1)(H−h) and then removing excess electrode material in a planarizing process.

In the method according to the invention the electrode material can be selected as an inorganic conducting material, e.g. a metal, or the electrode material can alternatively be selected as an organic conducting material, e.g. conducting polymer.

In a preferred embodiment of the invention the substrate is a semiconducting material, e.g. silicon, whereby the semiconducting material is processed to form an insulating layer against the electrode material or covered by an insulating thin film applied to the surface thereof.

In the method according to the invention the barrier material can advantageously be selected as an insulating inorganic or organic material, and the barrier material can then preferably be selected as a polarizable dielectric material capable of exhibiting hysteresis, e.g. a ferroelectric or electret material, and in case it is a ferroelectric or electret material, this can even more preferably be selected as a polymer or copolymer material.

Preferably the patterning of the electrode material to form electrodes takes place respectively by microlithography and etching, and it is then considered advantageous to use one and the same photomask for the patterning step, said photomask being displaced back and forth in translation over the same distance w+δ in the alternating process step sequences when patterning the electrodes respectively.

In a first preferred embodiment of the method according to the invention the final process step comprises covering the top surface of the electrodes with a global barrier layer, while in a second preferred embodiment the final process step leaves the barrier layer covering the top of every second electrode in the electrode means as applicable. Alternatively, in a third preferred embodiment the final process step leaves the electrodes as well as the barrier layers flush and exposed in the top surface of the electrode means.

In the method according to the invention the height H of the electrode layers can be selected from the second electrode layer on inclusive, as 2h. In the method according to the invention the electrode width can be selected as the minimum process-definable feature subject to the design rule of the applied patterning process.

Figure 2:
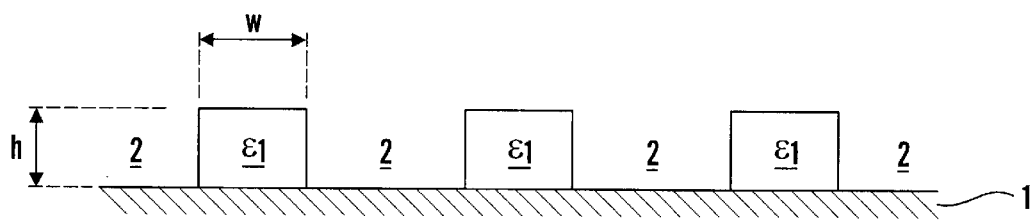
Figure 7:
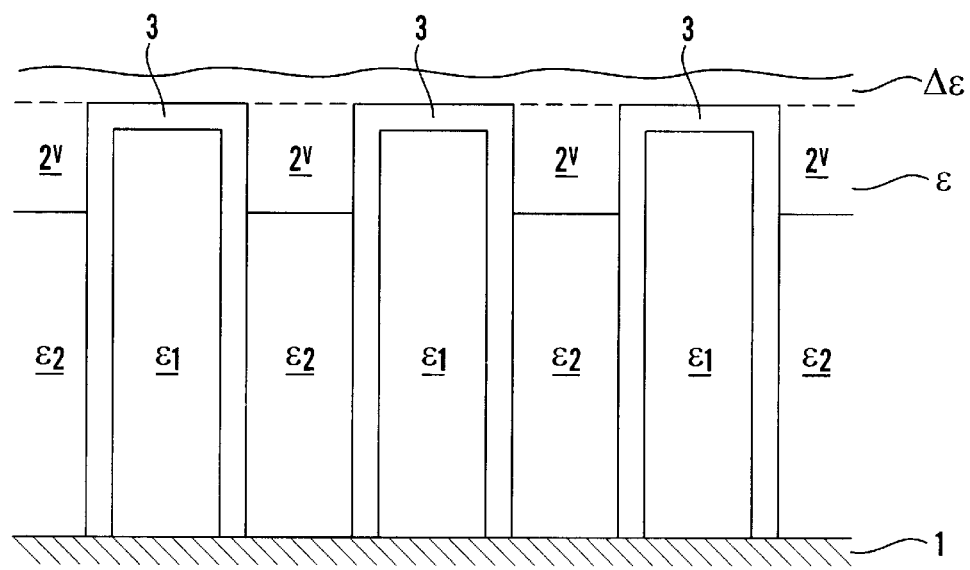
Figure 3A:
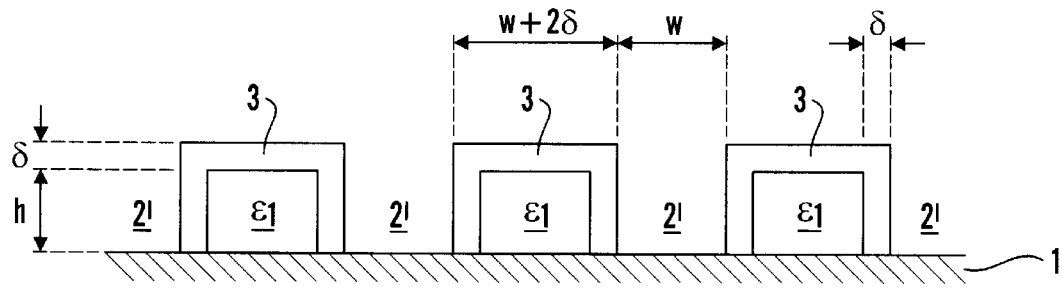
Figure 3B:
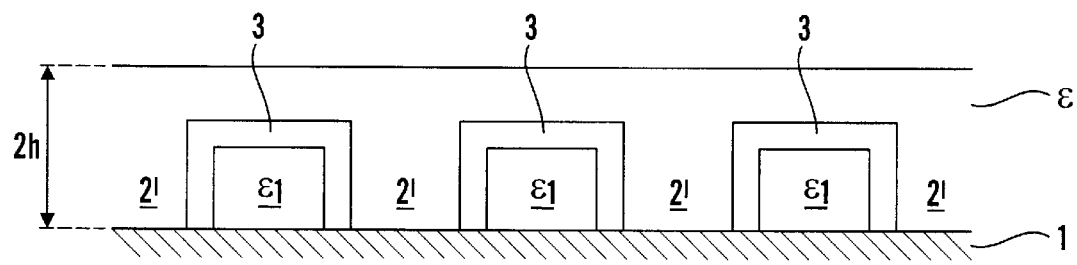
Figure 3C:
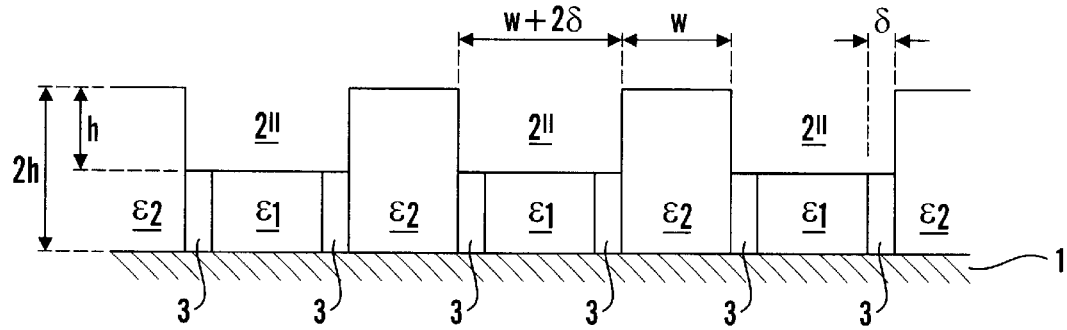
Figure 8:
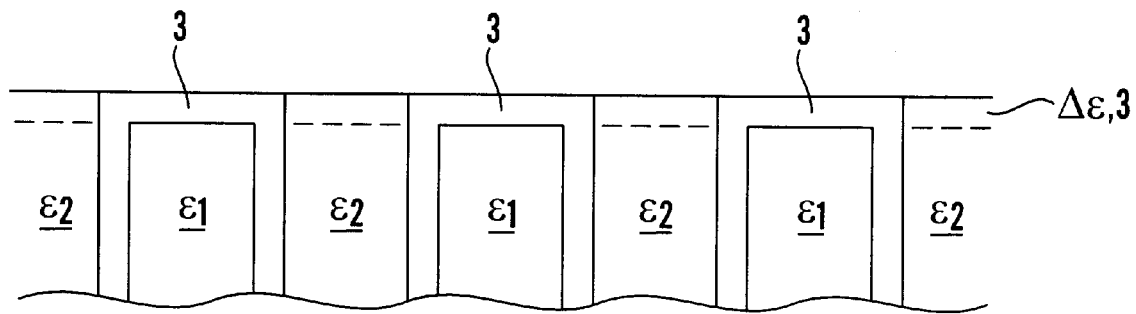
Figure 9:
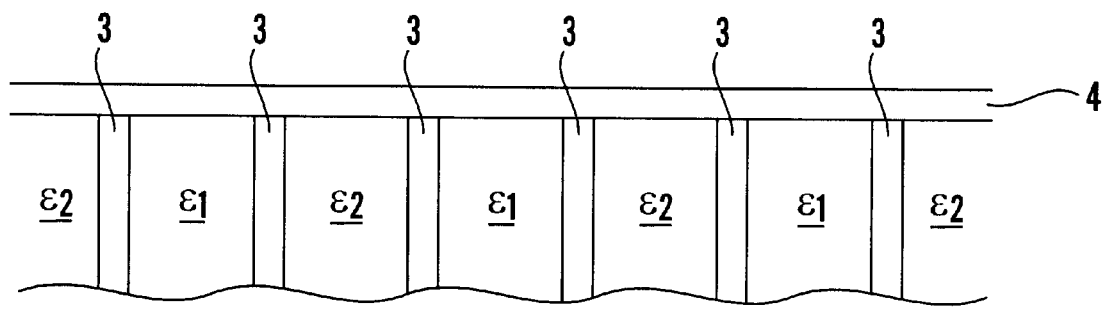
Figure 10:
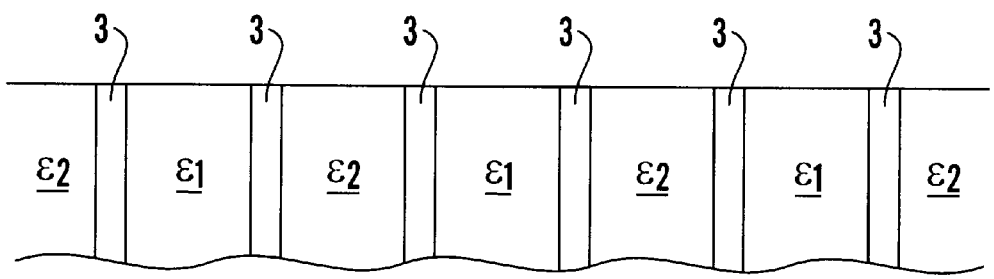
Figure 11A:
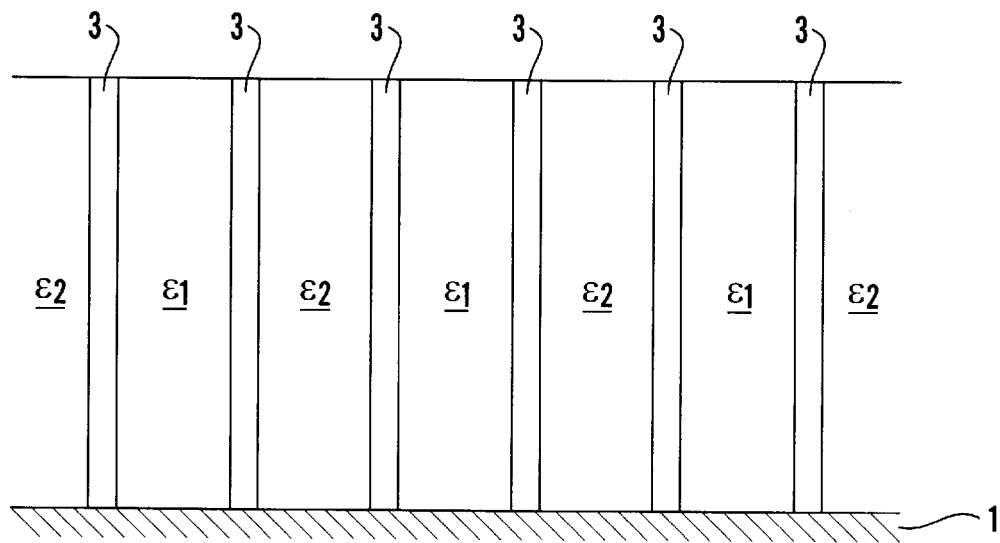
Figure 11B:
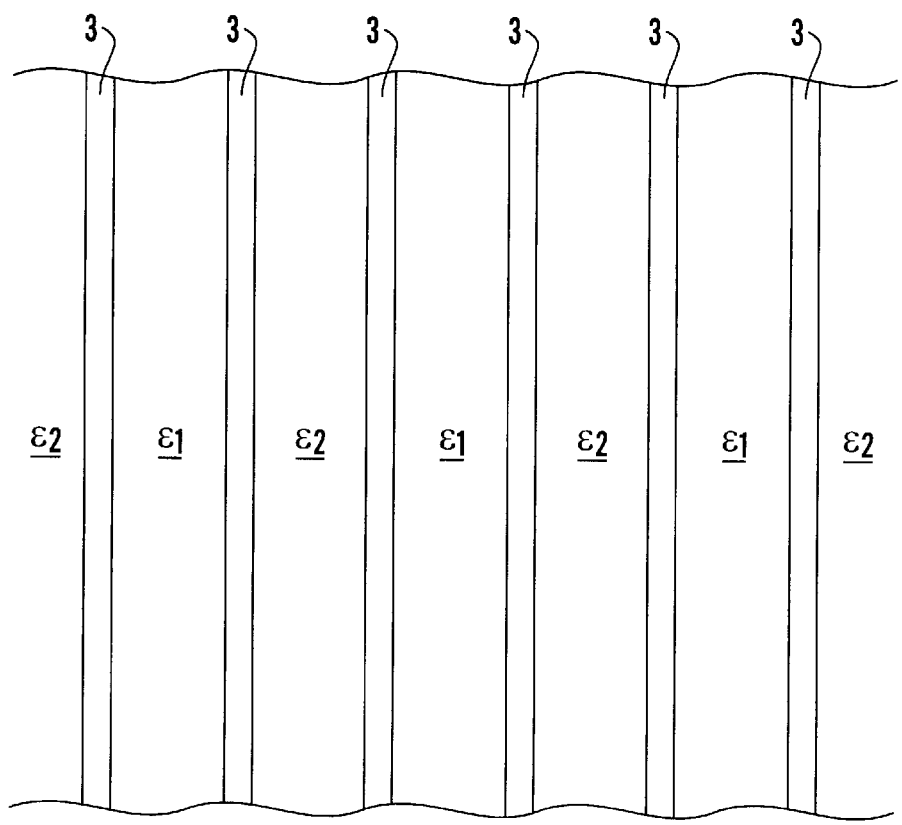

The present invention shall now be explained in the following description of an exemplary and preferred embodiment of the method and with reference to the appended drawing figures, of which FIG. 1 shows a cross section of global electrode layer deposited on a substrate, FIG. 2 a cross section of a first set of parallel electrodes patterned in the layer of electrode material in FIG. 1, FIG. 3a a cross section of the electrodes in FIG. 2 provided with a barrier layer, FIG. 3b a cross section of the embodiment in FIG. 3a now covered with the global layer of electrode material, FIG. 3c the patterning of the global layer of electrode material shown in FIG. 3b to form second electrodes between the first electrodes, FIGS. 4a–c in cross section how the process steps shown in FIGS. 3a–3c are repeated for increasing the height of the first electrodes, FIGS. 5a–5c in cross section of how a second repetition of the process steps shown in FIGS. 3a–c are repeated for increasing the height of the second electrodes of the electrode means, FIGS. 6a–6c in cross section how of the process steps shown in FIGS. 3a–c are repeated for increasing the height of the first electrodes of the electrode means, FIG. 7 in cross section a final process step for obtaining a planar electrode means, FIG. 8 in partial cross section a first preferred embodiment of the top surface of the finished electrode means, FIG. 9 in partial cross section a second preferred embodiment of the top surface of the finished electrode means, FIG. 10 in partial cross section a third preferred embodiment of the top surface of the finished electrode means, FIG. 11a in full cross section the finished electrode means as embodied and shown in FIG. 10, and FIG. 11b a plan view of the electrode means in FIG. 11a.

Now follows a step-by-step description of the method according to the present invention discussing preferred embodiments of the successive process steps performed therein.

In FIG. 1 a global layer of electrode material $\epsilon$ is provided with a height h on a suitable substrate 1, which for instance could be a semiconducting material like silicon and appropriately surface-treated to provide insulation against the electrode material $\epsilon$. Then a photomicrolithographic process with etching is applied to the layer of electrode material E to provide patterned first electrodes $\epsilon_1$ as shown in FIG. 2. This leaves, as shown in cross section, the electrodes $\epsilon_1$ approximately as rectangular or square ridges on the substrate 1, the electrodes $\epsilon_1$ having of course the height h and the width w corresponding to a mask width. Recesses 2 are formed between the electrodes $\epsilon_1$ and with a width not smaller than a minimum process-constrained feature obtainable in the photomicrolithographic process as given by the design rule thereof. If this minimum process-constrained feature is equal to the electrode width w, the width of the recess 2 could be also equal to w. The patterned electrodes $\epsilon_1$ are now covered by an extremely thin barrier layer 3 with e.g. dielectric or insulating properties as shown in FIG. 3a. This barrier layer 2 could e.g. be made of a ferroelectric or electret material, i.e. material which is polarizable and capable of exhibiting hysteresis when subjected to an applied electric field. As the barrier layer 3 is provided with a thickness of e.g. $\delta$, the mask width could now be selected such as to leave the recesses 2' with a width w similar to that of the electrodes $\epsilon_1$ and similarly it will be evident that a distance d between an electrode $\epsilon_1$ and the following parallel electrode $\epsilon_1$ will be w+2$\delta$, the resulting so-called pitch then obtaining the value 2w+2$\delta$, as this pitch corresponds to the repetition distance of the electrode pattern as shown in FIG. 3a, where all the relevant dimensions have been depicted. It is, of course, to be understood that the values of these dimensions, i.e. w, $\delta$ and h may be freely selected but subject to constraint by any applicable design rule. The electrodes $\epsilon_1$ covered with barrier layer 3 are now covered by applying another global layer of electrode material $\epsilon$, preferably to a height H=2h and above the substrate as shown in FIG. 3b. The same photomask as used for patterning the electrodes $\epsilon_1$ in the process step shown in FIG. 2 is now shifted laterally, with a distance w+$\delta$ corresponding to the width of the original recess 2 between the electrodes $\epsilon_1$ less the barrier thickness $\delta$. The electrode material $\epsilon$ of the globally applied layer as well as the barrier layer 3 covering the electrodes $\epsilon_1$ are removed e.g. in etching process down to the top surface of the electrodes $\epsilon_1$, creating second electrodes $\epsilon_2$ in the recesses 2' shown in FIGS. 3a and 3b and extending to a height of say H=2h above the surface of the substrate 1, while a recess 2" with a width w+2$\delta$ is now formed between the electrodes $\epsilon_2$ and above the electrodes $\epsilon_1$. Simultaneously the barrier layer 3 is left providing insulation between the electrodes $\epsilon_1$ and electrodes $\epsilon_2$.

Figure 4A:
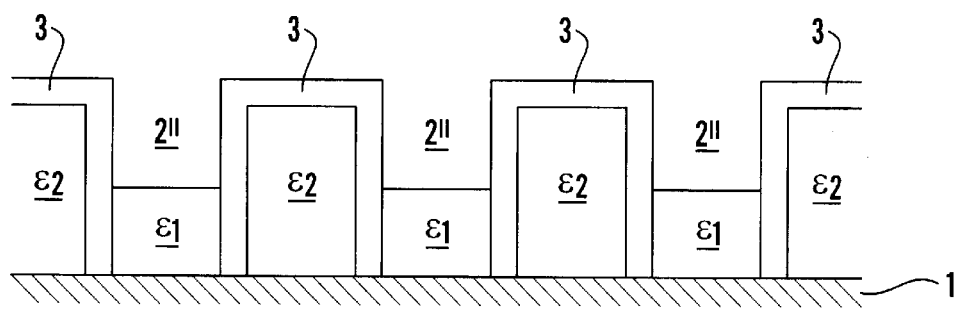
Figure 4B:
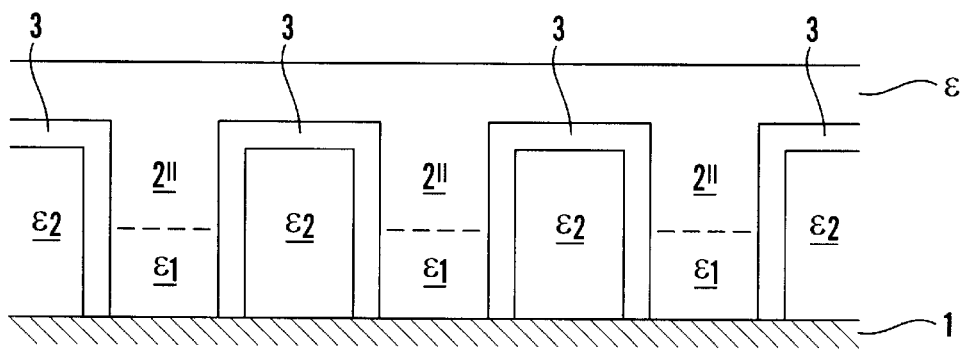
Figure 4C:
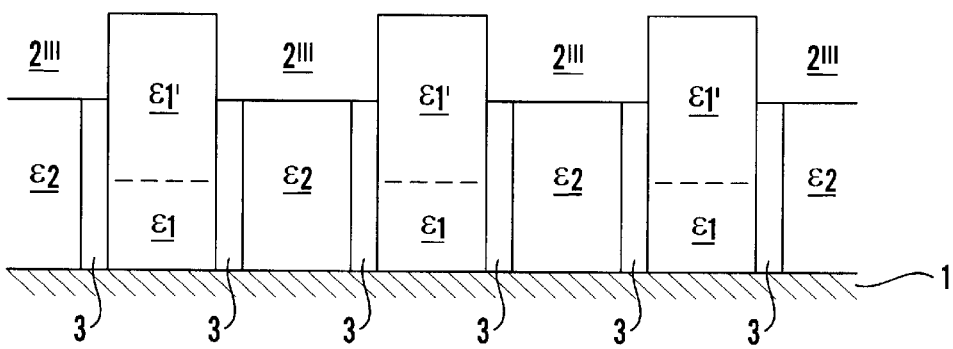

Now follows a process step similar to that in FIG. 3a and as depicted in FIG. 4a, wherein the exposed or raised portion of the electrodes $\epsilon_2$ is covered with barrier material to form the barrier layer 3 with the same properties as before, thus leaving the recess 2" with its width reduced by twice the thickness 6 of the barrier layer 3 between the raised portion of electrodes $\epsilon_2$ and above the electrodes $\epsilon_1$. FIG. 4b renders a process step similar to that in FIG. 3b, i.e. another global layer of electrode material $\epsilon$ is applied above the already formed electrodes $\epsilon_1$, $\epsilon_2$ and filling the recesses 2" between the latter, this layer of electrode material $\epsilon$ preferably being applied with the same height as shown in FIG. 3b, i.e. 2h. FIG. 4c corresponds to the process step depicted in FIG. 3c and differs only by shifting the same photomask as before by the distance w+$\delta$ and then removing the electrode material $\epsilon$ above the electrodes $\epsilon_2$ as well as the barrier layer 3 down to the top surface thereof, thus creating a recess 2''' between the raised portions of the electrodes $\epsilon_1$. As will be seen this now adds another portion $\epsilon_1$' to the electrodes $\epsilon_1$ and increases their aspect ratio, as clearly seen in FIG. 4c.

Figure 5A:
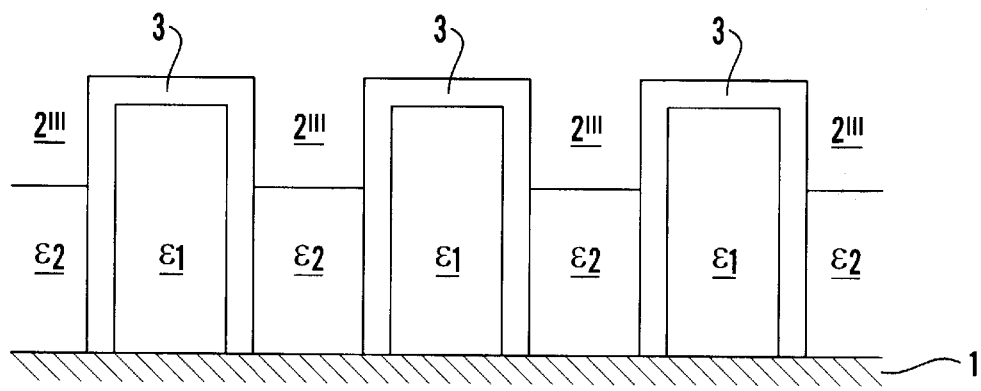
Figure 5B:
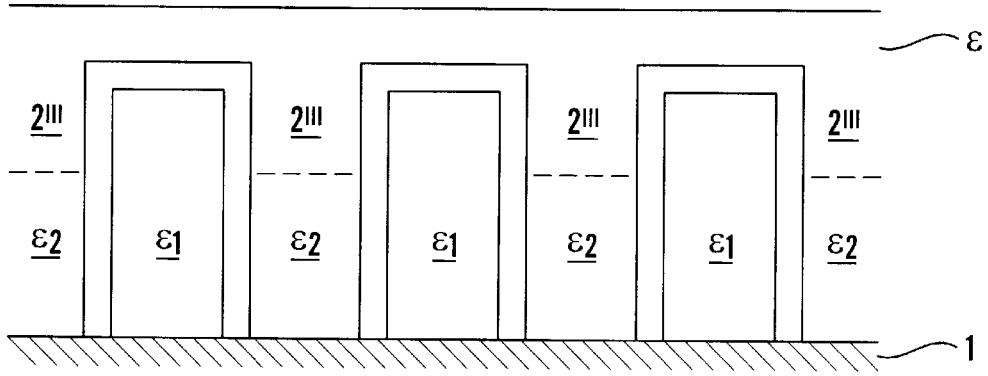
Figure 5C:
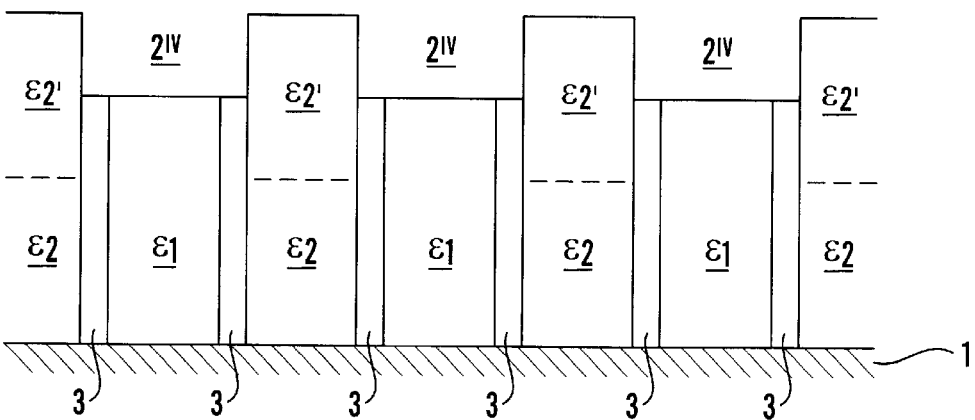
Figure 6A:
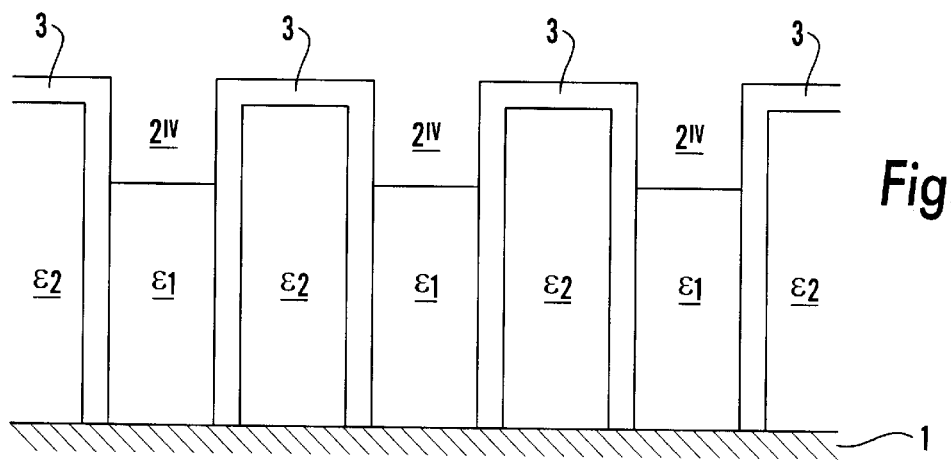
Figure 6B:
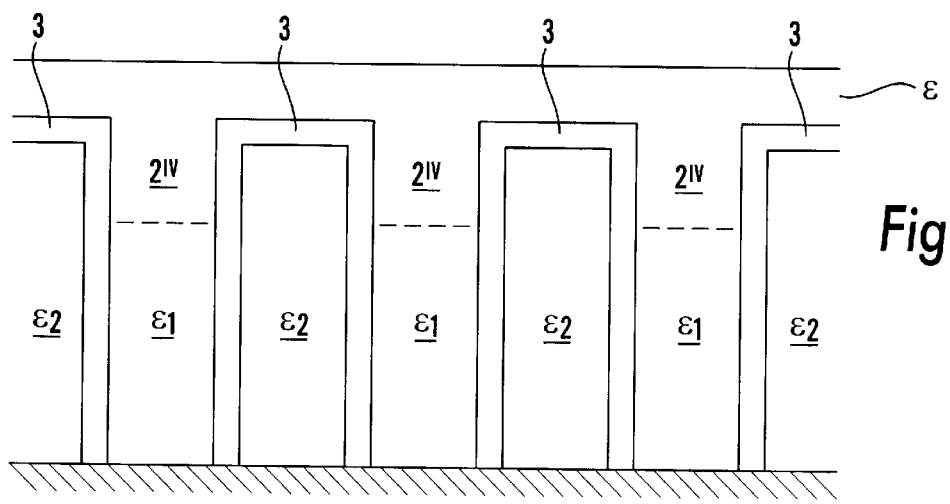
Figure 6C:
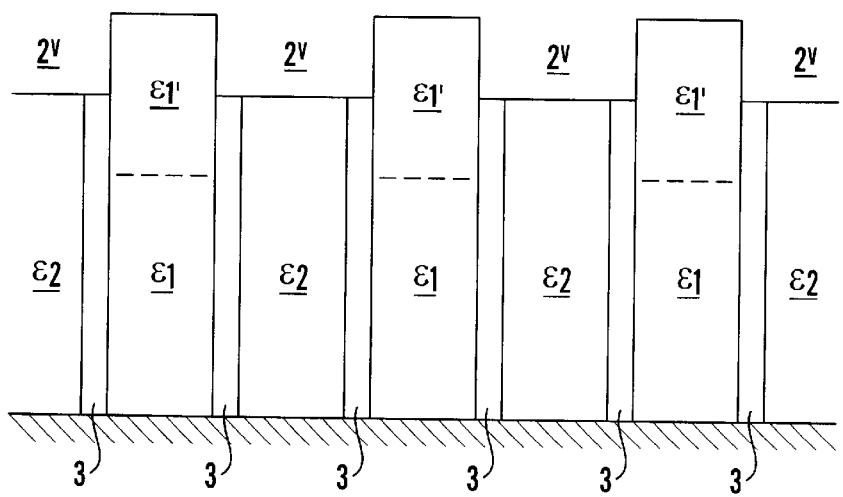

In order to further increase the aspect ratio of the electrodes $\epsilon_2$, process steps corresponding those depicted in either FIGS. 3a–c or FIGS. 4a–c are now applied as shown in FIGS. 5a–c. As shown in FIG. 5a the raised portion of the electrodes $\epsilon_1$ is once more covered by a barrier layer 3, and then as shown in FIG. 5b a global layer of electrode material $\epsilon$ is applied over the electrodes $\epsilon_1$ and the barrier layer 3, filling the recesses 2''' therebetween down to the top surface of the electrodes $\epsilon_2$ as already formed. The photomask is now once more shifted in the necessary distance and the electrode material $\epsilon$ above the electrodes $\epsilon_1$ and the barrier layer 3 is removed, creating a structure as shown in cross section in FIG. 5c. The aspect ratio of the electrodes $\epsilon_2$ is now increased by adding the portion $\epsilon_2$' thereof and leaving recesses 2hu iv therebetween down to the top surface of the already provided electrodes $\epsilon_1$.

Again can the process steps as shown e.g. in any of the FIGS. 3, 4 and 5 above now be repeated. In FIG. 6a the barrier layer 3 is provided above the raised and exposed portions of the electrodes $\epsilon_2$, and then another layer of electrode material $\epsilon$ is applied over the electrodes and filling the recesses $2^{iv}$ as shown in FIG. 6b. The photomask is then again shifted as before and the excess electrode material $\epsilon$ etched away above the electrodes $\epsilon_2$, leaving the barrier layer between the electrodes $\epsilon_1$, $\epsilon_2$ and forming a recess $2^v$ between the electrodes $\epsilon_1$ as shown in FIG. 6c and extending to the height of the electrodes $\epsilon_1$ being increased by an amount corresponding to the height of the portion $\epsilon_1$', thus also increasing the aspect ratio of the electrodes $\epsilon_1$. All the time the barrier material 3 remains providing insulation between the electrodes $\epsilon_1$, $\epsilon_2$ and as shown in FIG. 6c. The process steps depicted in either of the FIG. 3,4,5 or 6 can then be repeated in succession as many times as wished for in order to obtain the required aspect ratio of the electrodes $\epsilon_1$, $\epsilon_2$. If it is now considered that the height of the electrodes $\epsilon_1$ as provided after the step in FIG. 6c is sufficient, a final and concluding process step is performed as shown in FIG. 7 whereby the barrier layer 3 is applied covering the raised portion of the electrodes $\epsilon_1$ and then a global layer of electrode material $\epsilon$ is applied over the electrodes $\epsilon_1$, $\epsilon_2$ and filling the recesses $2^v$ between the electrodes $\epsilon_1$ and above the electrodes $\epsilon_2$. This electrode material $\epsilon$ is deposited with an excess thickness of about $\Delta\epsilon$ which now is removed in a planarization step as e.g. depicted in the embodiment shown in partial cross section in FIG. 8. Herein the electrodes $\epsilon_1$ are still covered with a planarized top surface of the barrier layer 3, while the top surfaces of the electrode $\epsilon_2$ is exposed therebetween. However, in another preferred embodiment shown in partial cross section in FIG. 9 the planarization step is carried out so as to remove the barrier layer 3 covering the top surface of the electrodes $\epsilon_1$ and the portion of excess electrode material $\epsilon$ on the top of the electrodes $\epsilon_2$, thus obtaining all the electrodes $\epsilon_1$, $\epsilon_2$ in the electrode means with the same height and mutually isolated by the barrier layer 3. Now the top surfaces of the electrodes $\epsilon_1$, $\epsilon_2$ and the barrier layers 3 between the electrodes $\epsilon_1$, $\epsilon_2$ may be covered by another barrier layer 4 which can be the same material as that of the barrier layers 3 or a different material. Barrier layer 4 can e.g. also be a ferroelectric or electret material or e.g. a ferroelectric polymer, but could as well be another insulating material.

A third embodiment of the finished electrode means are shown in FIG. 10, which again only renders the cross section of the top portion of the electrode means. Here the electrodes $\epsilon_1$, as well as $\epsilon_2$ and the mutually insulating barrier layers 3 therebetween have been planarized in a final step to provide the electrodes $\epsilon_1$, $\epsilon_2$, with equal height and exposed to the exterior in their top surfaces. This shall result in an electrode means of the kind shown in cross section in FIG. 11a and in plan view in FIG. 11b, and it will be seen that the electrodes $\epsilon_1$, $\epsilon_2$ are obtained with a very high aspect ratio and in very dense arrangement, which by using a thickness δ for the barrier layer 3 being only is a tiny fraction of the say the electrode width w, shall ensure a fill factor of the electrode material in the electrode means approaching unity.

The method of building electrodes with a high aspect ratio according to the present invention removes all disadvantages and weaknesses inherent in prior art technology. The barrier layer material 3 is provided in situ after each sequence of process steps and thus the problem of having to fill a very narrow and deep recess in a final process step is completely eliminated. Simultaneously only the final process step involves planarization and only a single photomask will be needed as it can be used by simply shifting its position the appropriate distance in every repeated sequence of the process steps. By advantageously selecting the value h not larger than that factors effecting the quality of the removal or etching process can be controlled to produce uniform and smooth side edges of the electrodes $\epsilon_1$, $\epsilon_2$ in the removal of excess electrode material $\epsilon$, disadvantages and faults which will be inherent in the use of a single etching step, i.e. deep etching to obtain high aspect ratio electrodes, also will be eliminated.

Thus it will be seen that the method according to the present invention not only removes the problems inherent in prior art when used to fabricate the electrodes with as high aspect ratio as desired, but also leads to much reduced costs, as only a single photomask is used and only a final planarization step is involved.

The electrode means with parallel electrodes in a very dense arrangement and high aspect ratio can be applied in all circumstances where such electrodes with high aspect ratio are desired, be it memory devices or transistor devices or integrated transistor/memory devices where geometries are involved that shall benefit from such high aspect ratio electrodes. Further it shall be understood that the resulting electrode means, e.g. as depicted in FIG. 11a and FIG. 11b, can be combined to form a stack of volumetric devices and with e.g. the electrode means arranged such that the electrodes in alternating electrode means are oriented crosswise, preferably orthogonally to each other and with functional material provided and made addressable as given by any geometry obtainable with electrode means of this kind. It is, however, understood that specific geometrical configurations considered advantageous for use with high aspect ratio electrode in various memory and switching devices can be obtained in various post-processing operations and hence are not made a subject of the present application.

What is claimed is:

1. A method for building high aspect ratio electrodes in an electrode means (E) comprising parallel electrodes ($\epsilon_1$,$\epsilon_2$) in a dense arrangement, wherein the method comprises successive process steps for:
   a) depositing a first global layer of electrode material ($\epsilon$) with height h on a substrate (1);
   b) patterning the electrode material ($\epsilon$) to form first parallel electrodes ($\epsilon_1$) of the electrode means (E), said first electrodes ($\epsilon_1$) having a width w and height h and being separated by a recess (2) of width d, and wherein the method is characterized by comprising successive further process steps for
   c) covering the first electrodes ($\epsilon_1$) with a barrier layer of thickness δ, δ being a fraction of width w, whereby the width d of the recess (2) becomes equal to 2w+2δ;
   d) depositing a second global layer of electrode material ($\epsilon$) over the first electrodes ($\epsilon_1$) with the barrier layer (3) and filling the recesses (2) therewith;
   e) patterning a second layer of electrode material ($\epsilon$) to form second parallel electrodes ($\epsilon_2$) of the electrode means (E) in the recesses (2') between the electrodes ($\epsilon_1$) and the barrier layer (3) covering the latter, said second electrodes ($\epsilon_1$) extending above the first electrodes ($\epsilon_1$) to a height H−h and being insulated therefrom by means of the barrier layer (3), whereafter the sequence of process steps c)−e) are alternatingly applied as required to the first and second electrodes ($\epsilon_1$,$\epsilon_2$) respectively until the desired aspect ratio (n+1)(H−h)/w for all electrodes is obtained in a final process step after performing n sequences of the successive process steps c)−e), a final process step comprising applying electrode material to obtain electrodes ($\epsilon_1\epsilon_2$) with approximately equal height (n+1)(H−h) and then removing excess electrode material ($\epsilon$) in a planarizing process.

2. A method according to claim 1, characterized by the electrode material ($\epsilon$) being selected as an inorganic conducting material, e.g. a metal.

3. A method according to claim 1, characterized by the electrode material ($\epsilon$) being selected as an organic conducting material, e.g. a conducting polymer.

4. A method according to claim 1, characterized by the substrate being a semiconducting material, e.g. silicon, whereby the semiconducting material has been processed to form an insulating layer against the electrode material or covered by an insulating thin film applied to the surface thereof.

5. A method according to claim 1, characterized by the barrier material being selected as an insulating inorganic or organic material.

6. A method according to claim 5, characterized by the barrier material being selected as a polarizable dielectric material capable of exhibiting hysteresis, e.g. a ferroelectric or electret material.

7. A method according to claim 6, characterized by the ferroelectric or electret material being selected as a polymer or copolymer material.

8. A method according to claim 1, characterized by the patterning of the electrode material ($\epsilon$) to form electrodes ($\epsilon_1$,$\epsilon_2$) respectively by photomicrolithography and etching.

9. A method according to claim 8, characterized by using one and the same photomask for the patterning step, said photomask being displaced back and forth in translation over the same distance w+δ in the alternating process step sequences when patterning the electrodes ($\epsilon_1$) and electrodes ($\epsilon_2$) respectively.

10. A method according to claim 1, characterized by the final process step comprising covering the top surface of the electrodes ($\epsilon_1,\epsilon_2$) with a global barrier layer (4).

11. A method according to claim 1, characterized by the final process step leaving the barrier layer (3) covering the top of every second electrode ($\epsilon_1;\epsilon_2$) in the electrode means (E) as applicable.

12. A method according to claim 1, characterized by the final process step leaving the electrodes ($\epsilon_1;\epsilon_2$) as well as the barrier layer (3) flush and exposed in the top surface of the electrode means (E).

13. A method according to claim 1, characterized by selecting the height H of the electrode layers from the second electrode layer on inclusive, as 2h.

14. A method according to claim 1, characterized by the electrode width w being selected as the minimum process-definable feature subject to the design rule of the applied patterning process.

* * * * *